US006995412B2

(12) United States Patent  (10) Patent No.: US 6,995,412 B2
Fried et al.  (45) Date of Patent: Feb. 7, 2006

(54) INTEGRATED CIRCUIT WITH CAPACITORS HAVING A FIN STRUCTURE

(75) Inventors: David M. Fried, Ithaca, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 10/063,331

(22) Filed: Apr. 12, 2002

(65) Prior Publication Data
US 2003/0193058 A1   Oct. 16, 2003

(51) Int. Cl.
H01L 27/108   (2006.01)
H01L 29/76   (2006.01)
H01L 29/94   (2006.01)
H01L 31/119   (2006.01)

(52) U.S. Cl. .................. 257/296; 257/303; 257/306
(58) Field of Classification Search ............... 257/296, 257/300, 301, 303, 306, 68, 71, 313, 516, 257/532, 528, 535
See application file for complete search history.

(56) References Cited

U.S. PATENT DOCUMENTS

| RE32,090 E | 3/1986 | Jaccodine et al. |
|---|---|---|
| 4,704,368 A | 11/1987 | Goth et al. |
| 5,013,680 A | 5/1991 | Lowrey et al. |
| 5,105,245 A | 4/1992 | Riemenschneider et al. |
| 5,225,363 A | 7/1993 | Riemenschneider et al. |
| 5,356,826 A * | 10/1994 | Natsume ............ 438/238 |
| 5,566,051 A | 10/1996 | Burns |
| 5,573,967 A | 11/1996 | Tseng |
| 5,619,067 A | 4/1997 | Sua et al. |
| 5,786,985 A | 7/1998 | Taniguchi et al. |
| 5,838,032 A * | 11/1998 | Ting .................. 257/211 |
| 5,869,859 A * | 2/1999 | Hanagasaki ............ 257/296 |
| 5,898,982 A | 5/1999 | Metzler et al. |
| 5,902,126 A | 5/1999 | Hong et al. |
| 5,956,236 A | 9/1999 | Corisis et al. |
| 5,976,960 A | 11/1999 | Cheffings |
| 5,995,378 A | 11/1999 | Farnsworth et al. |
| 6,037,620 A | 3/2000 | Hoeningschmid et al. |

(Continued)

FOREIGN PATENT DOCUMENTS

JP   183254 A   7/1995

OTHER PUBLICATIONS

"FinFet Process Demonstration, Deliverable Report: Test Chip and Process Design", King, et al., Task ID. 850.002.

*Primary Examiner*—Hoa Pham
(74) *Attorney, Agent, or Firm*—Schmeiser, Olsen & Watts; William Sabo

(57) ABSTRACT

Device designs and methods are described for incorporating capacitors commonly used in planar CMOS technology into a FinFET based technology. A capacitor includes at least one single-crystal Fin structure having a top surface and a first side surface opposite a second side surface. Adjacent the top surface of the at least one Fin structure is at least one insulator structure. Adjacent the at least one insulator structure and over a portion of the at least one Fin structure is at least one conductor structure. Decoupling capacitors may be formed at the circuit device level using simple design changes within the same integration method, thereby allowing any number, combination, and/or type of decoupling capacitors to be fabricated easily along with other devices on the same substrate to provide effective decoupling capacitance in an area-efficient manner with superior high-frequency response.

13 Claims, 8 Drawing Sheets

U.S. PATENT DOCUMENTS

| | | | |
|---|---|---|---|
| 6,069,060 A * | 5/2000 | Matsumoto et al. | 438/486 |
| 6,087,226 A | 7/2000 | Kim et al. | |
| 6,121,650 A * | 9/2000 | Akamatsu | 257/296 |
| 6,121,651 A | 9/2000 | Furukawa et al. | |
| 6,140,214 A | 10/2000 | Violette et al. | |
| 6,291,847 B1 * | 9/2001 | Ohyu et al. | 257/306 |
| 6,300,653 B1 * | 10/2001 | Pan | 257/296 |
| 6,309,945 B1 * | 10/2001 | Sato et al. | 438/409 |
| 6,320,237 B1 | 11/2001 | Assaderaghi et al. | |
| 6,407,442 B2 * | 6/2002 | Inoue et al. | 257/535 |
| 6,627,936 B2 * | 9/2003 | Ishii | 257/296 |

* cited by examiner

INTEGRATED CIRCUIT WITH CAPACITORS HAVING A FIN STRUCTURE

BACKGROUND OF THE INVENTION

Technical Field

The present invention relates generally to the field of semiconductor manufacturing and, more specifically, to Fin-type decoupling capacitors.

In recent years, the need to remain cost and performance competitive in the production of semiconductor devices has caused continually increasing device density in integrated circuits. To facilitate the increase in device density, new technologies are constantly needed to allow the feature size of these semiconductor devices to be reduced.

In the semiconductor industry, large, planar capacitors formed by two plates separated by a dielectric have been used in many semiconductor designs for the purpose of decoupling noise from power lines. In earlier integrated circuits, much of the decoupling capacitance could be placed off-chip due to the relatively slow cycle times at which such circuits operated. As semiconductor fabrication technologies advance, however, ever increasing device densities have resulted in a need to provide dense capacitors with high capacitance, for various purposes. For example, there are requirements for capacitors for certain analog circuits and functions. Another purpose may be for noise decoupling of power supply nodes. Additionally, the high switching rates used in a modern integrated circuit may cause the power supply voltage to degrade at certain points in the circuit and may cause circuit failures. Decoupling capacitors may be used to reduce supply voltage variations arising from high switching rates in the supplied circuits. These decoupling capacitors are connected between the supply voltage ($V_{dd}$) and ground ($V_{ss}$) in parallel with the supplied circuit. This parallel capacitance tends to decouple the voltage supply from disturbances induced by activity in the supplied circuit and allow the voltage supply to remain at the intended level.

The slow frequency response of off-chip capacitance makes off-chip capacitor arrangements unsuitable for providing the decoupling capacitance necessary to prevent circuit failures in high speed integrated circuit devices.

Accordingly, in order to provide sufficient decoupling capacitance for high frequency circuits, the capacitance must be moved closer to the switching circuitry, onto the integrated circuit chip itself. However, there are various areas of concern in on-chip decoupling capacitor design.

First, the on-chip capacitance should be provided in an area-efficient manner so as not to take up excessive space on the respective chip. Furthermore, on-chip capacitors should be easy to fabricate along with the active and passive circuit elements which make up the desired integrated circuit (i.e., through the same integration). Moreover, different types of decoupling capacitors should be available on the same chip. For example, in certain applications it is desirable to have a thick oxide capacitor. A thick oxide capacitor has lower leakage and higher reliability, however it supplies less capacitance per unit area. Thus, tradeoffs must be made among leakage, reliability, and density. If leakage is less of a concern and the reliability tradeoffs are not big, then a thin oxide capacitor tends to be a better choice.

Using a Fin field effect transistor (FinFET) based technology provides advantages toward high speed CMOS. FETs are the basic electrical devices of today's integrated circuits and are used in almost all types of integrated circuit design (i.e., microprocessors, memory, etc.). A FinFET is one type of FET that has been proposed to facilitate increased device performance. In a FinFET, a vertical "fin" shaped structure is defined to form the body of the transistor. Gates are then formed on one or both sides of the Fin. When gates are formed on both sides of the Fin, the transistor is generally referred to as a double gate FinFET. In particular, the use of the double gate suppresses Short Channel Effects (SCE), provides for lower leakage, and provides for more ideal switching behavior. In addition, the use of the double gate increases gate area, which allows the FinFET to have better current control, without increasing the gate length also called "gate thickness") of the device. As such, the FinFET is able to have the current control of a larger transistor without requiring the device space of the larger transistor.

However, using a FinFET based technology to solve the foregoing problems requires a redesign of capacitors. Thus, there is a need for improved and redesigned capacitor structures that incorporate capacitors commonly used in planar CMOS technology into a FinFET based technology.

BRIEF SUMMARY OF THE INVENTION

Accordingly, the invention provides device designs and methods for incorporating capacitors commonly used in planar complementary metal oxide semiconductor (CMOS) technology into a Fin field effect transistor (FinFET) based technology. The capacitors of the invention and other circuit devices may be formed at the device level (i.e., the level in the integrated circuit (IC) at which transistors and other circuit elements are formed) using simple design changes within the same integration method, but without multiple different oxidations and depositions. Thus, simultaneously in one integration method, different designs will yield any number, combination, and/or type of capacitors of the invention (e.g. nominal-voltage, high-voltage, implant variations of the foregoing, etc.), CMOS FinFETs, and/or other devices on the same substrate in order to provide effective decoupling capacitance in an area-efficient manner with superior high-frequency response.

The capacitors of the invention may be implemented both in standard CMOS technology (commonly referred to as "bulk" semiconductor technology), and in silicon-on-insulator (SOI) technology. In addition, Sidewall Image Transfer (SIT) technology and/or Conventional Image Transfer (CIT) technology may be used to form the Fins for the various types of capacitors of the invention and other circuit devices.

Generally, at least one capacitor of the invention includes at least one single-crystal Fin structure having a top surface and a first side surface opposite a second side surface. Adjacent the top surface of the Fin structure is at least one insulator structure. Adjacent the insulator structure and over a portion of the at least one Fin structure is at least one conductor structure.

In one embodiment, the capacitor comprises a nominal-voltage decoupling capacitor. For this type of decoupling capacitor, the single-crystal Fin structure is narrow and the insulator structure is further adjacent both the first side surface and the second side surface of the Fin structure, thereby encapsulating the Fin structure. Thus, for example, a nominal-voltage decoupling capacitor according to the invention may be designed in the same manner as a FinFET except that the gate is used as one plate of the decoupling capacitor, the thin gate dielectric is used as the capacitive dielectric, and a source/drain (S/D) region formed from the Fin structure(typically connected in later processing steps) is used as the other plate. Additionally, after the narrow Fin structure is formed, it may be doped heavily or not to vary the capacitive behavior of the device.

In another embodiment of the invention, the capacitor comprises a high-voltage decoupling capacitor. For this type of decoupling capacitor, the single-crystal Fin structure is broad and the conductor structure is within a thickness of the Fin structure. Thus, for example, a high-voltage decoupling capacitor according to the invention may be designed in the same manner as a FinFET except the remaining thick hardmask left after the broad Fin etch serves as the capacitive dielectric, the broad Fin serves as one plate, and the gate atop the thick dielectric and defined to be entirely within the thickness of the broad Fin serves as the other plate. Both plates may be contacted by way of a local interconnect. Additionally, as with the previous embodiment, after the broad Fin structure is formed, it may be doped heavily or not to vary the capacitive behavior of the device.

In still another embodiment, the capacitor of the invention comprises a combination of nominal-voltage decoupling capacitors, high-voltage decoupling capacitors, and/or their implant variations.

The foregoing and other features and advantages of the present invention will be apparent from the following more particular description of embodiments of the invention, as illustrated in the accompanying drawings.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION OF THE INVENTION

Figure 1:
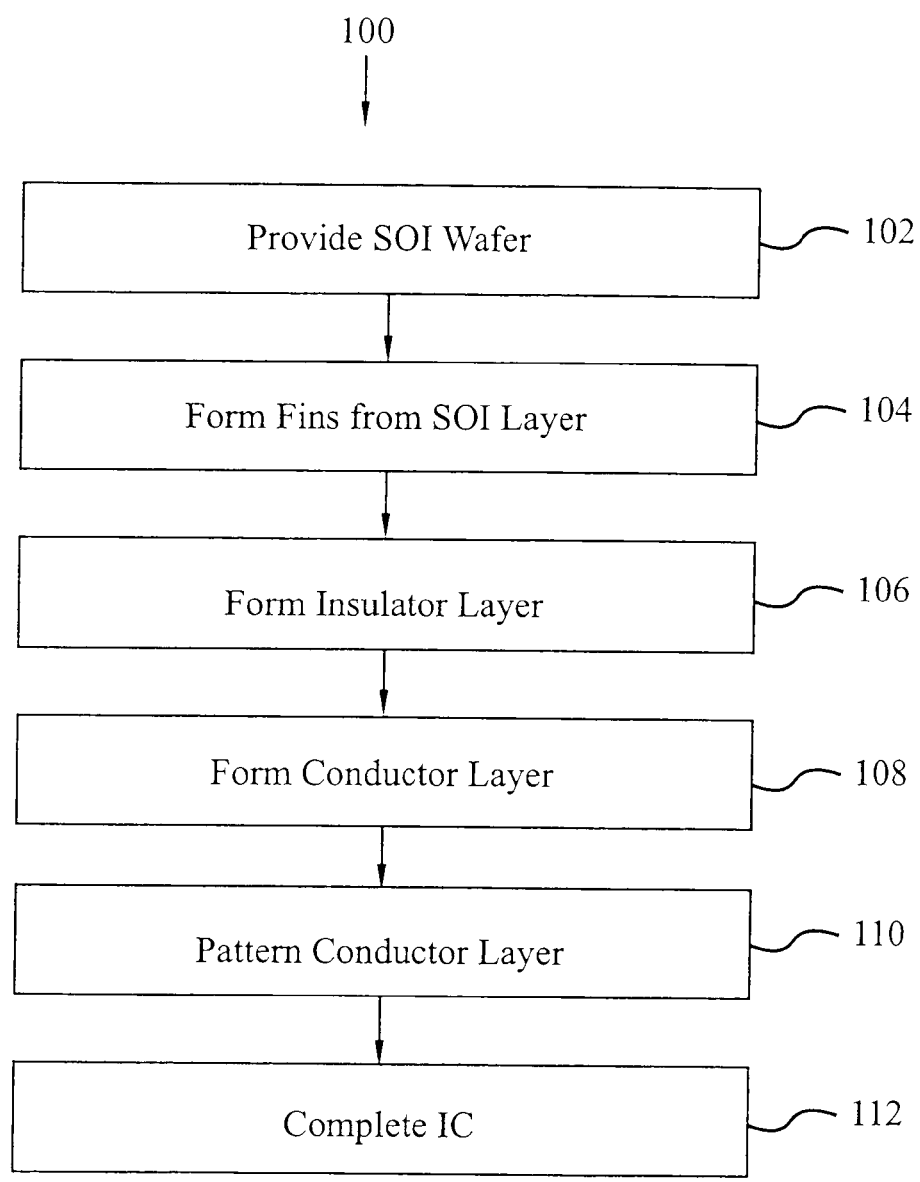
FIG. 1 is a flow diagram illustrating a fabrication method embodiment of the invention.

The present invention may be readily adapted to a variety of device designs and methods for forming the same that incorporate capacitors commonly used in planar complementary metal oxide semiconductor (CMOS) technology into a Fin field effect transistor (FinFET) based technology. Generally, the present invention provides at least one capacitor that includes at least one single-crystal Fin structure having a top surface and a first side surface opposite a second side surface. Adjacent the top surface of the at least one Fin structure is at least one insulator structure. Adjacent the at least one insulator structure and over a portion of the at least one Fin structure is at least one conductor structure.

The decoupling capacitors of the invention and other circuit devices may be formed at the device level (i.e., the level in the integrated circuit (IC) at which transistors and other circuit elements are formed) using simple design changes within the same integration method, but without multiple different oxidations and depositions. Thus, simultaneously in one integration method, different designs will yield any number, combination, and/or type of decoupling capacitors of the invention (e.g. nominal-voltage, high-voltage, implant variations of the foregoing, etc.), CMOS FinFET's, and/or other devices on the same substrate in order to provide effective decoupling capacitance in an area-efficient manner with superior high-frequency response.

It will be understood by one of ordinary skill in the art that the invention is not limited to the specific structures illustrated in the drawings, as the structures are shown in greatly exaggerated scale and boundary lines between materials in the structures may not form straight lines as depicted for purposes of illustration in the drawings. It will also be understood by one of ordinary skill in the art that the invention is not limited to the specific fabrication steps detailed herein. Numerous semiconductor fabrication processes may be used to produce a decoupling capacitor embodying the principles of the invention. As will be made clear, the decoupling capacitors of the invention and other semiconductor devices may be implemented both in standard CMOS technology (commonly referred to as "bulk" semiconductor technology), and in silicon-on-insulator (SOI) technology. These processes are advantageous because each step may correspond to a step which is already required in producing an IC. However, decoupling capacitors within the scope of the invention may be fabricated in steps entirely separate from those used in producing other devices on an IC, and using many alternate fabrication techniques. Moreover, it will also be understood by one of ordinary skill in the art that the invention is not limited to use of any specific dopant types provided that the dopant types selected for the various components are consistent with the intended electrical operation of the device.

Turning now to FIG. 1, exemplary integration method 100 for forming an IC in accordance with the present invention is illustrated. Generally, and for the exemplary purposes of this disclosure, method 100 may form an IC with any number, combination, and/or type of decoupling capacitors of the present invention (e.g. nominal-voltage, high-voltage, implant variations of the foregoing, etc.), transistors (e.g. CMOS FinFETs), and/or other circuit devices by: providing an appropriate substrate, such as a SOI wafer for example; forming any number of narrow and/or broad Fins from SOI layer; forming and patterning insulator structures adjacent the Fins; forming and patterning conductor structures adjacent the insulator structures; and completing the IC.

As will be made clear, an important advantage of the decoupling capacitors of the invention relates to fabrication. Each fabrication step employed to produce the various structures included in the decoupling capacitors may also be employed to produce portions of other devices elsewhere on the same substrate. Therefore, decoupling capacitors according to the invention may be produced as an adjunct to the production of the various devices included in the IC without requiring additional fabrication steps, thereby incurring essentially no additional process cost. This advantage of the decoupling capacitors applies to both the bulk semiconductor and SOI implementations to be discussed.

Accordingly, first step 102 of method 100 is to provide an appropriate substrate. Referring to the substrate embodiment depicted in FIGS. 2a–2b, substrate 200 may comprise wafer 202 that underlies buried insulator 204 that underlies semiconductor layer 206. Therefore, for example, substrate 200 may comprise a single-crystal SOI wafer. However, other substrate 200 embodiments may be used, such as a non-SOI wafer comprising only wafer 202 for example. When a non-SOI wafer embodiment is used, the processing remains otherwise identical to that of a SOI wafer embodiment, except as noted.

Figure 2A:
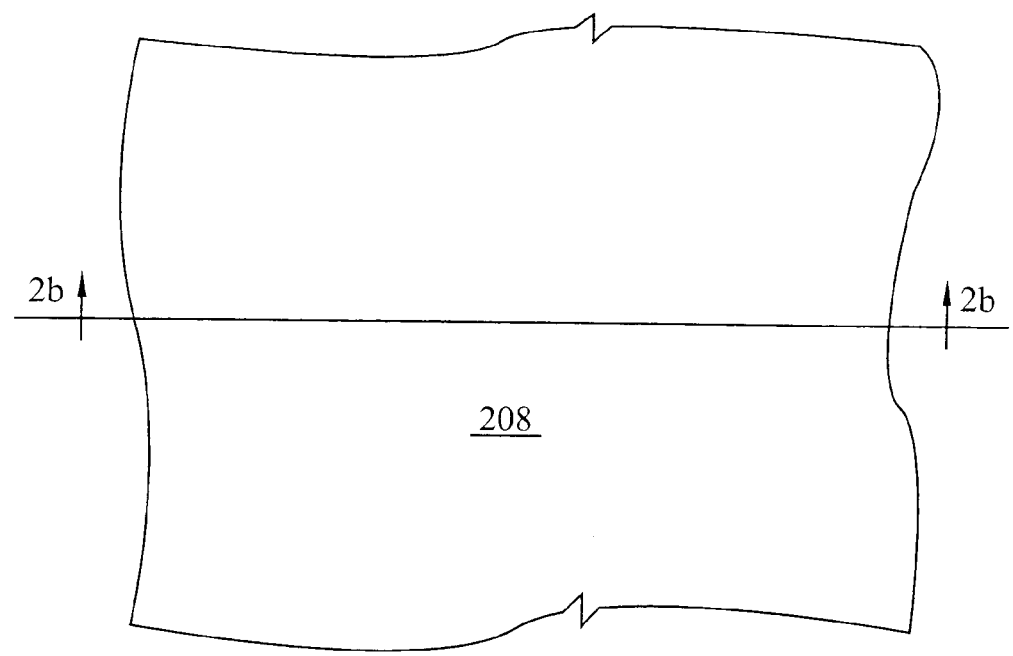
FIGS. 2a, 3a, 4a, 5a, 6a, and 7a are top plan views of embodiments of capacitor structures of the invention during the fabrication method of FIG. 1.
Figure 2B:
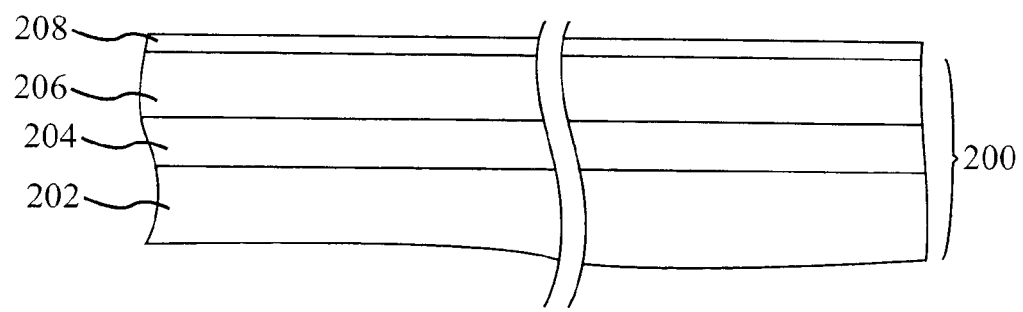
FIGS. 2b, 3b, 4b, 5b, 6b, and 7b are cross-sectional side views of embodiments of capacitor structures of the invention during the fabrication method of FIG. 1 taken along lines 2b—2b, 3b—3b, 4b—4b, 5b—5b, 6b—6b, and 7b—7b of FIGS. 2a, 3a, 4a, 5a, 6a, and 7a respectively.

Still referring to FIGS. 2a–2b, while wafer 202 is depicted as having a minimum of complexity, other wafers of varying complexity may be advantageously employed. Wafer 202 may be composed of any appropriate semiconducting material, including, but not limited to: Si, Ge, GaP, InAs, InP, SiGe, GaAs, or other III/V compounds. For the exemplary purposes of this disclosure, wafer 202 may comprise single-crystal silicon.

Buried insulator 204 may be formed on wafer 202 using Separation by Implantation and Oxidation (SIMOX) or by wafer bonding and etch-back, or other techniques known in the art. Buried insulator 204 may comprise any insulative material, such as Buried Oxide (BOX). However, any type and/or combination of buried insulators may be used for buried insulator 204.

Semiconductor layer 206 may be formed on buried insulator 204 by any technique known in the art, and may comprise any semiconductor material. For the exemplary purposes of this disclosure, semiconductor layer 206 comprises a single-crystal silicon-on-insulator (SOI) layer. Semiconductor layer 206 may have any height. For the exemplary purposes of this disclosure, semiconductor layer 206 may have a height between approximately 10 nm–160 nm. As will be made clear, the height semiconductor layer 206 may define the height of the Fins.

Turning now to FIGS. 2a–4b, step 104 of method 100 is to form narrow and/or broad Fins from semiconductor layer 206, and therefore, any number, combination, and/or type of Fin-type decoupling capacitors of the invention, CMOS FinFETs, and/or other circuit devices. For example, as will be made clear: 1) a portion of each Fin may act as a capacitive body (plate) in the case of a decoupling capacitor of the invention or as a transistor body in the case of a transistor; 2) each insulator structure formed adjacent the top surface, the first side surface, and/or the second opposing side surface of the respective Fin may act as capacitor dielectric in the case of a decoupling capacitor of the invention or as a gate dielectric in the case of a transistor; and 3) each conductor structure formed adjacent the insulator structure may act as an electrode (plate) in the case of a decoupling capacitor of the invention or as a gate in the case of a transistor.

The narrow and/or broad Fins may be formed in any of the previously proposed techniques, such as Sidewall Image Transfer (SIT) technology and/or Conventional Image Transfer (CIT) technology. Accordingly, for the exemplary purposes of this disclosure, narrow and/or broad Fins may be formed from semiconductor layer 206 in step 104 through CIT in the following manner.

The first step is to deposit hard mask film 208 as depicted in FIGS. 2a–2b. Hard mask film 208 acts as an etch stop layer and will be used throughout the Fin fabrication process when needed. Moreover, as will be made clear, a portion of hard mask film 208 forms what may be the capacitive dielectric for a high-voltage decoupling capacitor of the invention. For the exemplary purposes of this disclosure, hard mask film 208 may be silicon dioxide (SiO2) or silicon nitride (Si3N4). In FIGS. 2b, 3b, 4b, 5b, 6b, and 7b, the "thickness" direction is oriented from left to right (i.e., parallel to the top surface of the hard mask film 208) and the "height" direction is oriented upward or downward (i.e., perpendicular to the top surface of the hard mask film 208).

A next step is implemented to pattern and etch hard mask film 208 by any technique known in the art. For example, a suitable thin layer of photoresist (PR) may be used to cover the surface of hard mask film 208. Next, a mask or masks may be used to generate any pattern or patterns of narrow and/or broad lines on the PR overlying hard mask film 208. This provides flexibility within substrate 200 to designate narrow and/or broad Fins, and therefore, any number, combination, and/or type of Fin-type decoupling capacitors of the invention, CMOS FinFETs, and/or other circuit devices. As will be made clear, the particular narrow and/or broad Fin is defined by the appropriate mask to facilitate etching that Fin into substrate 200.

Figure 3A:
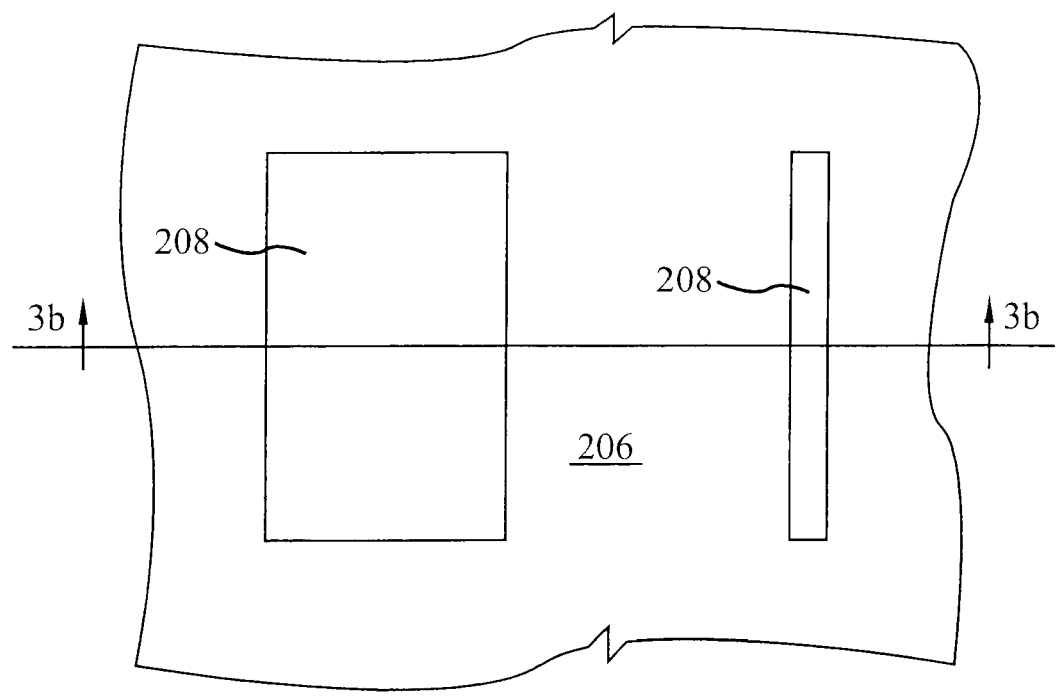
Figure 3B:
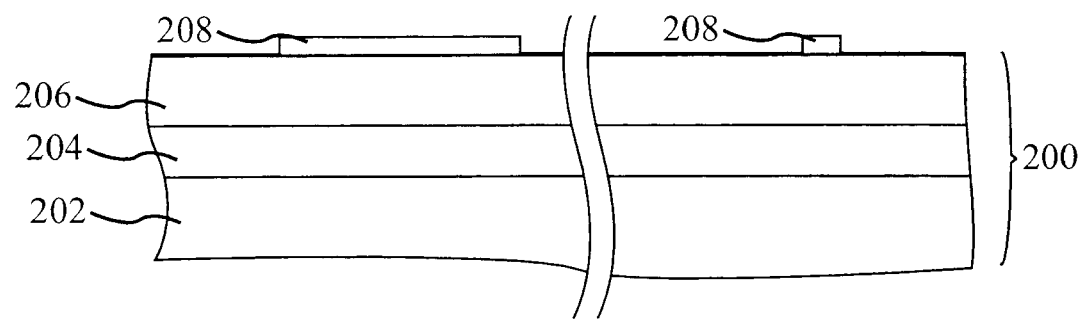

Once the narrow and/or broad lines on the PR overlying hard mask film 208 are generated, then a suitable directional etch may be performed through hard mask film 208 to form narrow and/or broad lines in hard mask film 208. For example, narrow lines typically have a thickness in the range of approximately 0.3 nm to 40 nm, while broad lines typically have a thickness that is greater than 40 nm. As will be made clear, the thickness of hard mask film 208 narrow and/or broad lines translates into the thickness of the narrow and/or broad Fins. The PR is then stripped away by a suitable chemical process, thereby resulting in hard mask film 208 narrow and/or broad lines on semiconductor layer 206 as depicted in FIGS. 3a–3b.

The next step is to anisotropically etch semiconductor layer 206 using hard mask film 208 narrow and/or broad lines, thereby forming narrow and/or broad Fins. This may be done using a suitable reactive ion etch (RIE) process that etches semiconductor layer 206, stopping on buried insulator 204.

Figure 4A:
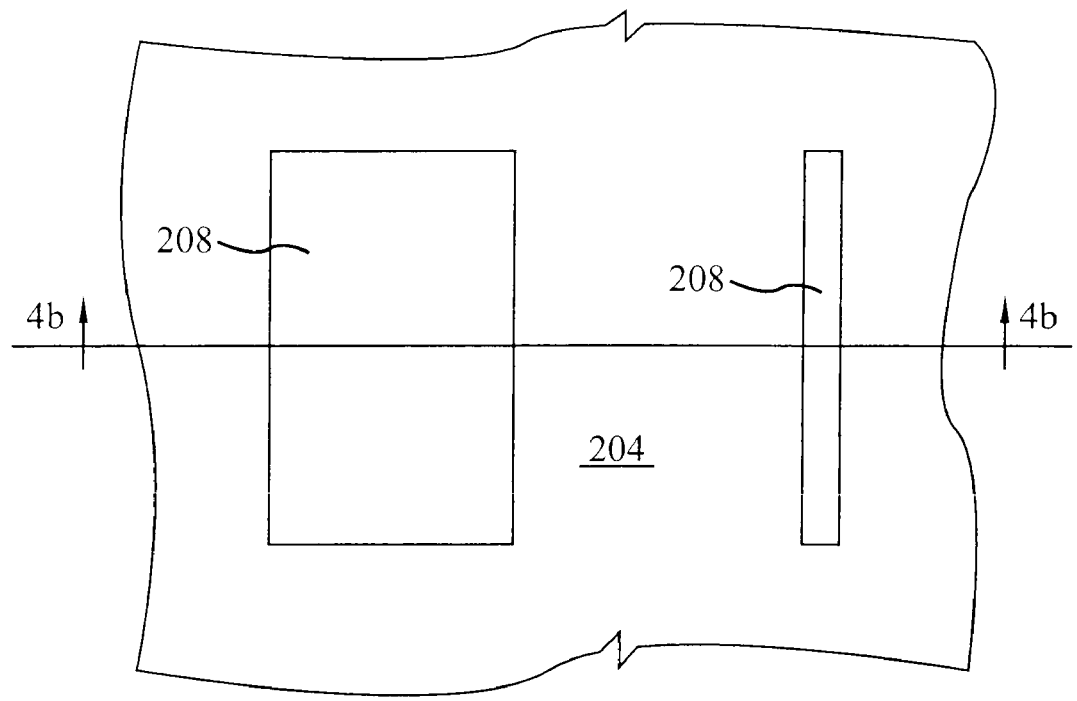
Figure 4B:
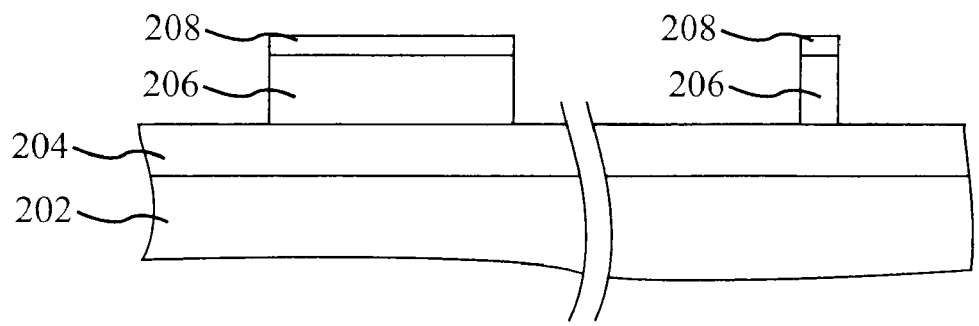

Thus, as depicted in FIGS. 4a–4b, narrow and/or broad Fins may remain and may comprise portions of semiconductor layer 206 with respective hard mask film 208 narrow and/or broad lines adjacent their top surfaces. Each Fin may have a top surface that is substantially horizontal to buried insulator 204 and opposing vertical sidewalls or surfaces that are substantially perpendicular to buried insulator 204.

Alternatively, for the exemplary purposes of this disclosure, in step 104, SIT may be used on substrate 200 so that only narrow Fins may be formed from semiconductor layer 206, or SIT and CIT may be combined on substrate 200 50 that both narrow and broad Fins may be formed from semiconductor layer 206. SIT allows the respective gate or electrode thickness of the devices to have minimum feature size, while allowing the thickness of the Fin body to be much smaller than the respective gate or electrode thickness. The Fin body thickness is determined by the image of a sidewall spacer, allowing the Fin body to be reliably formed at sub minimum feature size.

Generally, SIT involves the formation of at least one etch stop layer and a mandrel layer. The mandrel layer is then patterned, and sidewall spacers are formed adjacent the sidewalls of the patterned mandrel layer. Next, the mandrel layer is selectively removed. The SOI layer is then etched selective to the sidewall spacers, and thus, narrow Fins are defined using SIT.

More particularly, and for the exemplary purposes of this disclosure, in the first step of forming the narrow Fins from semiconductor layer 206, hard mask film 208 (an etch stop layer) is formed on semiconductor layer 206 similar to that depicted in FIGS. 2a–2b. Hard mask film 208 will be used throughout both the Fin fabrication process when needed.

Next, a mandrel layer is formed. As will be explained in greater detail later, the mandrel layer is a part of a sidewall image transfer which is used to define the narrow Fins. As such, the mandrel layer is used to form sidewall spacers, which are in turn used to define the narrow hard mask film 208 lines. The mandrel layer may have a height of between 10 nm and 200 nm.

The next steps are to pattern the mandrel layer, form sidewall spacers, remove the remaining mandrel layer, and pattern hard mask film 208. In patterning the mandrel layer, a PR mask may be produced over the surface of the mandrel layer which defines the location of an edge of a narrow Fin to be produced later. Then, by anisotropic etching, a substantially vertical edge may be created through the mandrel layer. Afterward, the PR mask may be removed. The sidewall spacers may then be formed adjacent the substantially vertical edge of the patterned mandrel layer. As will be shown later, the thickness of a sidewall spacer will define the thickness of the narrow Fin structure. The remaining mandrel layer is selectively removed. Etching of the mandrel layer may be done using a RIE process selective to the sidewall spacers and hard mask film 208. Then a suitable directional etch is performed through hard mask film 208 stopping on semiconductor layer 206, thereby forming hard mask film 208 narrow lines.

The next step is to remove the sidewall spacers down to hard mask film 208 narrow lines. Optionally, the sidewall spacers may be left in place.

The final step is to pattern semiconductor layer 206 using the hard mask film 208 narrow lines as masks. This may be done using a suitable anisotropic etching process that etches semiconductor layer 206 stopping on buried insulator 204. Additionally, it is generally desirable to have the thickness of the narrow Fins (i.e., the thickness of semiconductor layer 206 portions) less than the gate or electrode structure thickness. As the gate and electrode structure thickness is generally made to minimum feature size, SIT is used to achieve the subminimum feature size of the narrow Fins. Therefore, as described above, the thickness of the sidewall spacer determines the thickness of the narrow Fin.

Thus, narrow Fins remain and comprise narrow portions of semiconductor layer 206 with overlying hard mask film 208 narrow lines similar to the narrow Fin that is depicted in FIGS. 4a–4b.

Notwithstanding, CIT may also be combined with SIT on substrate 200 so that both narrow and broad Fins may be formed from semiconductor layer 206, since broad Fins may not be made with SIT. Accordingly, the CIT process described previously may simultaneously be implemented with the above SIT process so as to form broad Fins comprising broad portions of semiconductor layer 206 with overlying hard mask film 208 broad lines similar to the broad Fin that is depicted in FIGS. 4a–4b. Particularly, for example, after the steps of forming sidewall spacers and removing the mandrel layer in the above SIT process, a suitable thin layer of PR may be used to cover another portion or portions of the surface of hard mask film 208. Another alternative can be is to simply use a blocking mask over areas where broad Fins will be formed while carrying out the SIT process, then use a blocking mask that protects the sidewall spacers while the CIT process is carried out. Alternatively, these processes could be reversed. A second alternative is to form the mandrels, then use a blocking mask to protect the CIT areas while SIT is carried out, then use a suitable etchant for the process. Next, a mask or masks may be used to generate any pattern or patterns of narrow and/or broad lines on the PR overlying hard mask film 208. Thus, in effect, two different masks for different portions of substrate 200 are used at the same patterning level (same lithography step), one being the mask for the SIT Narrow Fin(s) and the other being the mask for the CIT broad Fin(s). Note that the FETs could be formed from either narrow or broad Fins; in practice, narrow Fins are preferred.

Then, a suitable directional etch may be performed through hard mask film 208 using the spacers and PR narrow and/or broad lines to form narrow and/or broad lines in hard mask film 208. The spacers and PR narrow and/or broad lines are then stripped away by a suitable chemical process, thereby resulting in hard mask film 208 narrow and/or broad lines on semiconductor layer 206 similar to those depicted in FIGS. 3a–3b.

The next step is to anisotropically etch semiconductor layer 206 using hard mask film 208. The final step is to pattern semiconductor layer 206 using the hard mask film 208 narrow and/or broad lines as masks, thereby forming narrow and/or broad Fins. Thus, narrow and/or broad Fins may remain similar to those depicted in FIGS. 4a–4b.

Whether the narrow and/or broad Fins depicted in FIGS. 4a–4b are formed by CIT and/or SIT, any or all of the Fins may then be lightly or heavily doped as needed so as to vary capacitive behavior in the case of decoupling capacitors of the invention or to form P-well structures and N-well structures in the case of NFETs and PFETs for example. In the case of decoupling capacitors of the invention, this may include an ion implantation into the Fins in order to form and allow in substrate 200 the integration of nominal-voltage and high-voltage decoupling capacitors that are more ideal in their electrical behaviors. Phosphorus (P), for example, is well suited for either type of decoupling capacitor. For example, ion implantation may be done at a dose of $1-3 \times 10^{15}$ $cm^{-2}$ to dope a single-crystal silicon Fin to be $1 \times 10^{20}$ $cm^{-2}$ N-Type. Ion implantation may comprise an angled implant into exposed opposing vertical sidewalls of the Fins, and would serve to properly dope the Fins.

In the case of NFETs and PFETs, doping may include an ion implantation into some of the Fins. P, As and Sb, for example, are well suited for PFETs. B, In and Ga, for example, are well suited for NFETs. Ion implantation is typically performed at a dose to achieve concentrations of between $1 \times 10^{17}$ $cm^{-3}$ to $5 \times 10^{18}$ $cm^{-3}$ for example. Again, ion implantation may comprise an angled implant into exposed opposing vertical sidewalls of the Fins, and would serve to properly dope the Fins.

When a non-SOI wafer embodiment is used, such as just wafer 202 for example, after the Fins are etched by time to the desired depth (typically approximately 100 nm–200 nm below wafer 202 surface), a deposit/etch oxide process is used to deposit $SiO_2$ exclusively on the bottom horizontal surfaces of etched wafer 202 of a height approximately one-quarter the height of the etched Fins. The oxide may be doped, and some portion of the dopant out-diffused into those portions of the Fins immediately adjacent to the doped oxide. For example, in the case of FinFET's, this serves to suppress leakage in what will be non-gated sidewalls of the Fins, from source to drain.

Figure 5A:
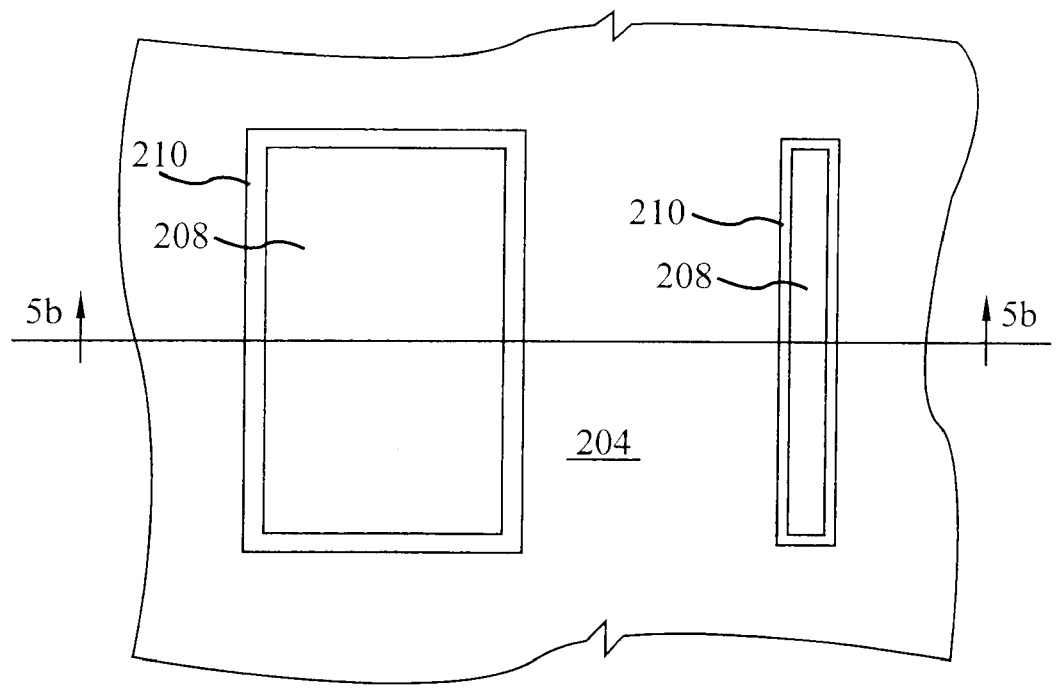
Figure 5B:
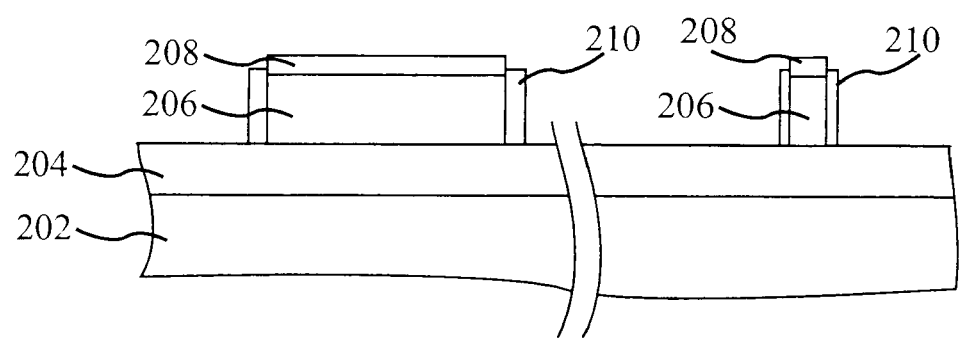

Turning to step 106 of method 100, insulator layers 210 are formed on opposing vertical sidewalls of the narrow and/or broad Fins (i.e., semiconductor layer 206 portions) as depicted in FIGS. 5a–5b. Insulator layers 210 may be formed by thermal oxidation, typically at 750–800 Å° C., or alternatively, may be formed by depositing a dielectric film. For the exemplary purposes of this disclosure, insulator layers 210 may be $SiO_2$, a nitrided oxide material, a high-K dielectric material, or combinations thereof, as known in the art. As will be made clear, insulator layers 210 on a narrow Fin form what may be the capacitive dielectric for a nominal-voltage decoupling capacitor of the invention.

Figure 6A:
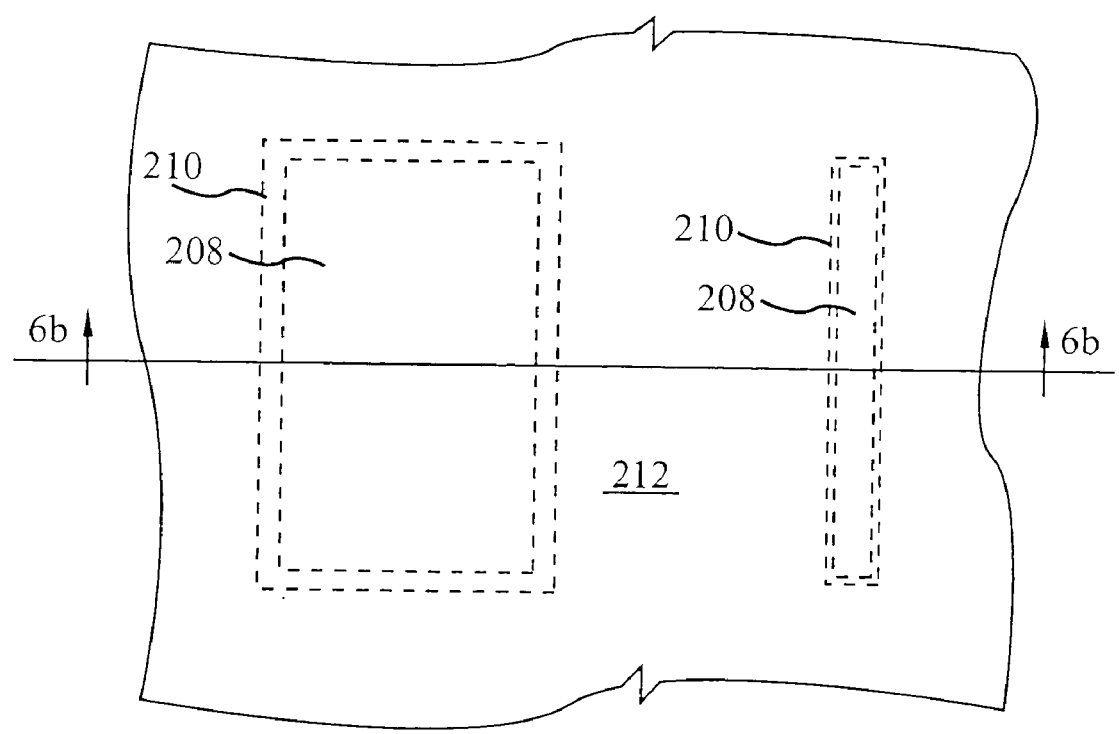
Figure 6B:
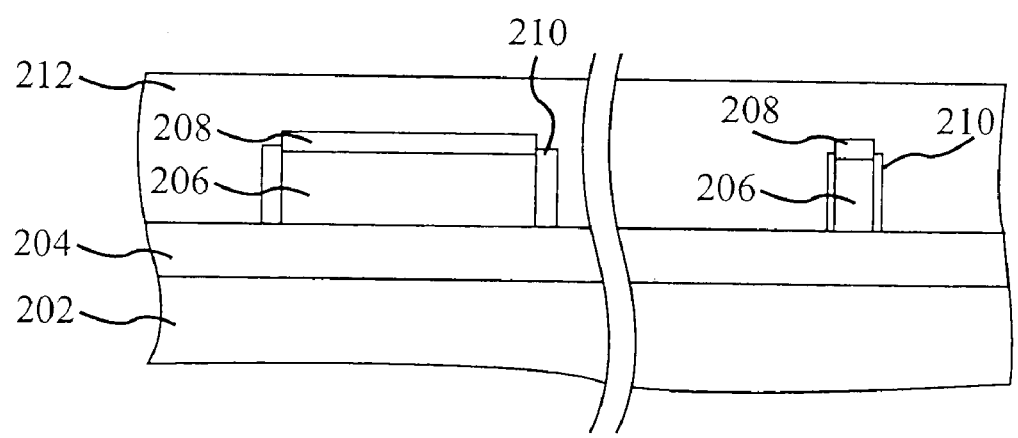

As depicted in FIGS. 6a–6b, step 108 of method 100 is to form an overlying conductor layer 212. Conductor layer 212 may be any suitable conducting material, typically a polycrystalline silicon material, although amorphous silicon, a combination of amorphous silicon and polysilicon, polysilicon-germanium, or any other appropriate material may be used to form gate conductor layer 212. In addition, in some embodiments of the present invention, it might be advantageous to employ a metal conductor layer 212, such as W, Mo, or Ta, or any other refractory metal, or alternatively, a silicided metal conductor comprising polysilicon added with Ni or Co. In step 108, where conductor layer 212 encompass a silicon material, such layers may be deposited as a doped layer (in-situ doping). Where conductor layer 212 is a metal layer, such layers may be deposited using physical vapor or chemical vapor deposition methods or any other technique known in the art.

Figure 7A:
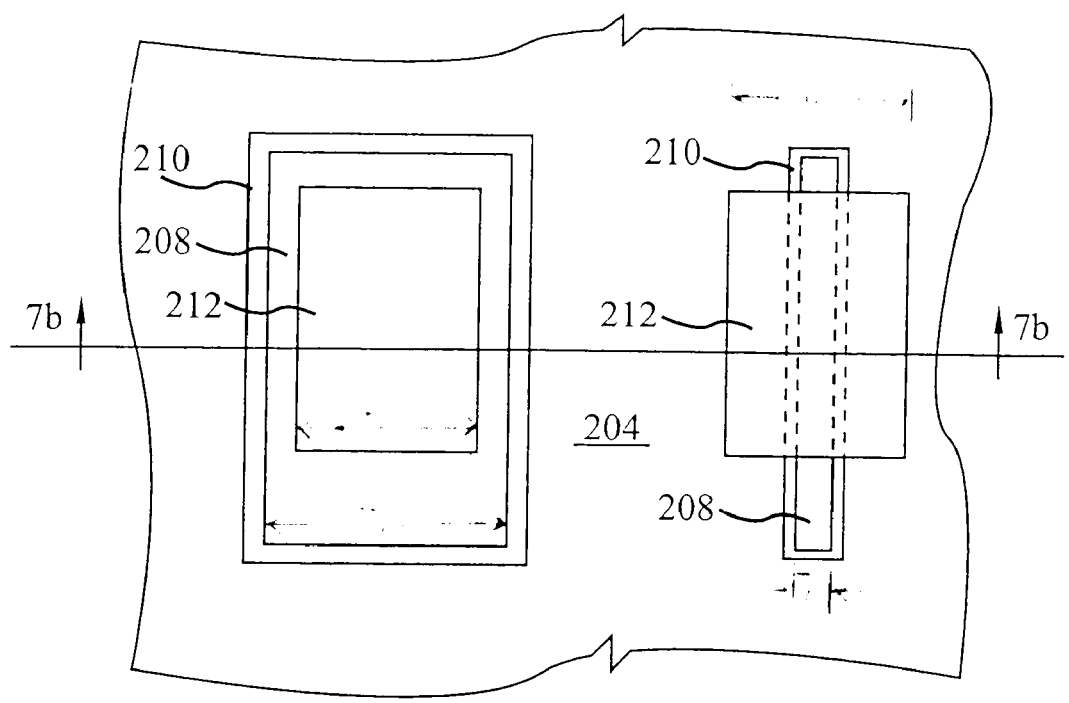
Figure 7B:
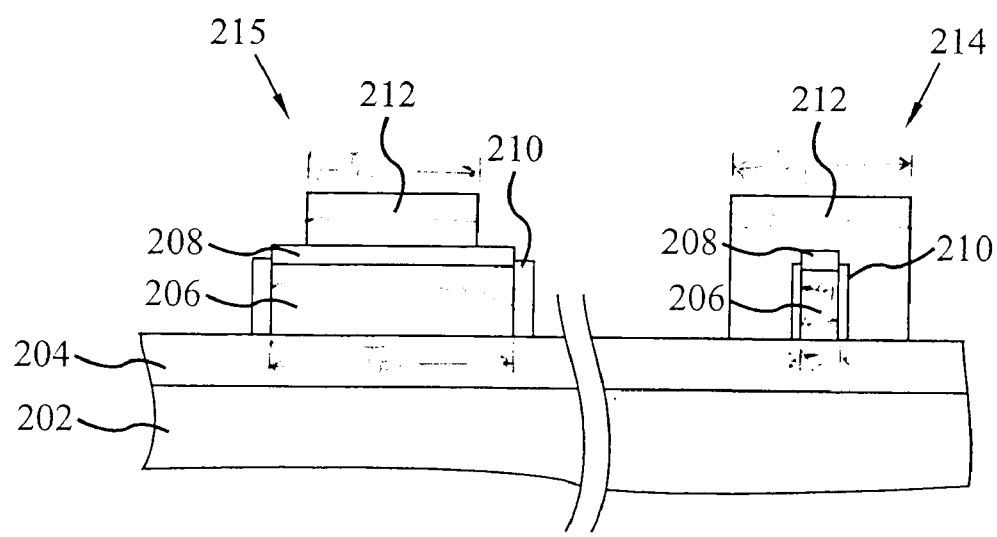

Turning to FIGS. 7a–7b, the next step 110 of method 100 is to pattern conductor layer 212. To implement step 110, a hard mask film is formed and patterned to facilitate the patterning of conductor layer 212. Typically, the hard mask film may be $SiO_2$ or $Si_3N_4$. Continuing with step 110, next is to pattern conductor layer 212. Accordingly, conductor layer 212 may be patterned and structured using well known photolithography and etching techniques (i.e., using the hard mask film as an etch block during a directional etching of conductor layer 212) to form, for example, electrodes for decoupling capacitors of the invention or gates for transistors. This may involve selectively removing portions of conductor layer 212 down to buried insulator 204, but not removing the narrow and/or broad portions of semiconductor layer 206 forming the narrow and/or broad Fins that are protected by hard mask film 208 narrow and/or broad lines.

Thus, for example, in FIGS. 7a–7b, nominal-voltage decoupling capacitor 214 and high-voltage decoupling capacitor 215 are depicted having a minimum of complexity. These depicted embodiments are at a stage of a process flow technique modified by an integration method of the present invention for forming any number, combination, and/or type of inventive decoupling capacitors, CMOS FinFET's, and/or other devices on the same substrate in order to provide effective decoupling capacitance in an area-efficient manner, Particularly, wafer 202 is depicted with an overlying buried insulator 204. On top of buried insulator 204 are nominal-voltage decoupling capacitor 214 and high-voltage decoupling capacitor 215. Nominal-voltage decoupling capacitor 214 comprises narrow semiconductor layer 206 portion (the narrow Fin) with overlying thick hard mask film 208 narrow line. Insulator layers 210 are formed on opposing vertical sidewalls of the narrow Fin. As seen in FIG. 7b, the top surface of the insulator layers 210 is adjacent to the hard mask film 208 (i.e., height of the ton surface of the insulator layers 210 is greater than the height of the lower surface of the hard mask film 208 and less the height of the upper surface of the hard mask film 208, wherein each of said heights are relative to the top surface of the buried insulator 204. Conductor layer 212 portion is structured adjacent insulator layer 210 portions and hard mask film 208 narrow line portion, thereby encapsulating the narrow Fin. High-voltage decoupling capacitor 215 comprises broad semiconductor layer 206 portion (the broad Fin) with overlying thick hard mask film 208 narrow line. Insulator layers 210 are formed on opposing vertical sidewalls of the broad Fin. Conductor layer 212 portion is structured adjacent hard mask film 208 broad line portion so that conductor layer 212 portion is within a thickness of the broad Fin. It is advantageous for the conductor layer 212 portion to partially overlay (or be within the thickness of) the broad Fin. If conductor layer 212 portion extended beyond the thickness of the broad Fin, thereby becoming additionally adjacent to a sidewall of the broad Fin, then a region of thin insulator on the sidewall would be exposed to high electric Fields when using this decoupling capacitor at higher voltages. This would result in significantly higher leakage currents through the capacitor and in decreased reliability. For the capacitor 215, the thickness of the Fin 206 is $T_{F1}$ and the thickness of the conductor layer 212 is $T_{C1}$ For the capacitor 214, the thickness of the Fin 206 is $T_{F2}$ and the thickness of the conductor layer 212 is $T_{C2}$. As seen in FIGS. 7a–7h for the capacitor 215, the thickness of the conductor layer 212 is within the thickness of the Fin 206, which means in FIGS. 7a–7b and in die claims that $T_{C1}<T_{F1}$ such that the sidewalls 11 and 12 of the conductor layer 212 arc each disposed between the sidewalls 21 and 22 of the Fin 206 as shown. Also as seen in FIGS. 7a–7b for the capacitor 214, the thickness of the Fin 206 is within the thickness of the conductor layer 212, which means in FIGS. 7a–7b and in the claims that $T_{F2}<T_{C2}$ such that the sidewalls 41 and 42 of the Fin 206 are each disposed between the sidewalls 31 and 32 of the conductor layer 212 as shown. FIGS. 7a–7h also show that $T_{F1}>T_{F2}$.

The decoupling capacitor embodiments of FIGS. 7a–7b (and/or any other decoupling capacitor embodiments of the present invention), CMOS FinFETs, and/or other devices may be completed according to step 112 of method 100. Accordingly, exposed portions of the Fins may be doped to form S/D regions (i.e. to produce FinFETs). The capacitor Fins may be masked during this step. For example, the S/D regions may define, in semiconductor layer 206 portions comprising transistor bodies, channel regions underlying the gate stacks. Formation of the S/D regions may be accomplished using any of the variety of methods that have been developed to form S/D regions and that are tailored for specific performance requirements. There are many such methods for forming S/D regions having various levels of complexity. Thus, in some embodiments of the present invention, using ion implantation for example, lightly doped S/D regions or other S/D regions may be formed. Thus, for example, for NFETs, typically P, As, or Sb for example is used for the S/D implants in the range of 1 to 5 keV and a dose of $5 \times 10^{14}$ to $2 \times 10^{15}$ $cm^{-2}$. Similarly, for PFETs, typically B, In, or Ga for example is used for the S/D implants in the range of 0.5 to 3 keV and dose of $5 \times 10^{14}$ to $2 \times 10^{15}$ $cm^{-2}$.

Optionally, extension and halo implants may be formed that improve Short Channel Effects (SCE). For NFETs, typically B, In, or Ga may be used for the halo implants with energies in the range of 5 to 15 keV and a dose of 1×1013 to 8×1013 cm–2. Similarly, for PFETs, P, As, or Sb may be used for the halos, with energies from 20 to 45 keV and dose of 1×1013 to 8×1013 cm–2.

Continuing with step 112, interconnects, contacts, wiring layers (located above the device level), etc. may then be produced in metallization steps known in the art. Accordingly, sources, drains, and electrodes may be contacted by way of a local interconnect(s) where, for example, interconnects may be disposed adjacent conductor layer 212 portions, and/or interconnects may be disposed adjacent the top surfaces, the first side surfaces, and/or the opposing second side surfaces of the sources or drains (doped exposed portions of the Fins). Contacts to sources, drains, electrodes, and gates may also be formed, such that e.g. the top electrode 212 of a capacitor 215 and/or 214 would be coupled to the source electrode of a FinFET. For example, a dielectric may be deposited and planarized typically using a chemical-mechanical polish process. Contact holes may then be structured and etched using an anisotropic process (e.g. reactive-ion etch) or the like. The contact holes may be filled using any conducting material, such as doped polysilicon, silicide (e.g. WSi), metals (e.g. Au, Al, Mo, W, Ta, Ti, Cu, or ITO (indium-tin oxide)), or the like, being deposited by evaporation, sputtering, or other known techniques, thereby forming contacts. Then the first metal layer may be deposited and structured using a RIE process or the like. Alternatively, the structuring of the first metal layer may be done following a damacene process flow.

Figure 8:
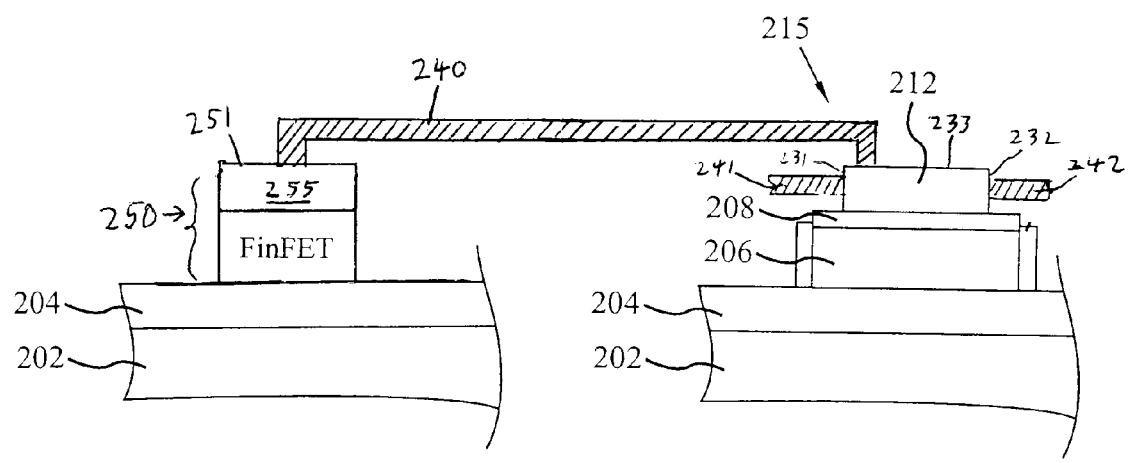
FIG. 8 is a cross-sectional side view of a FinFET coupled to a capacitor shown in FIG. 7b.
Figure 7A:
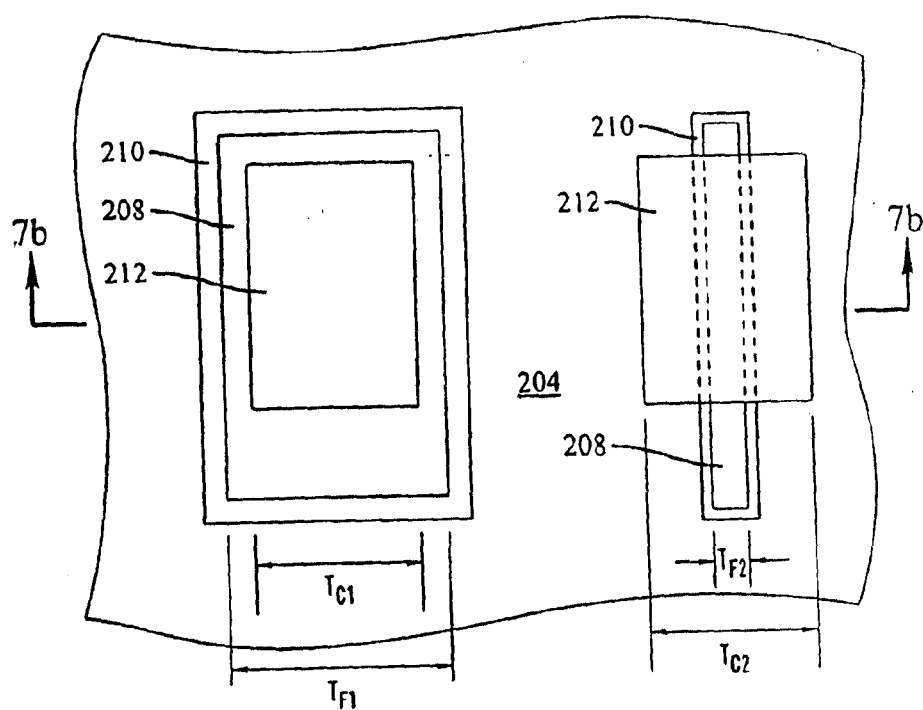
Figure 7B:
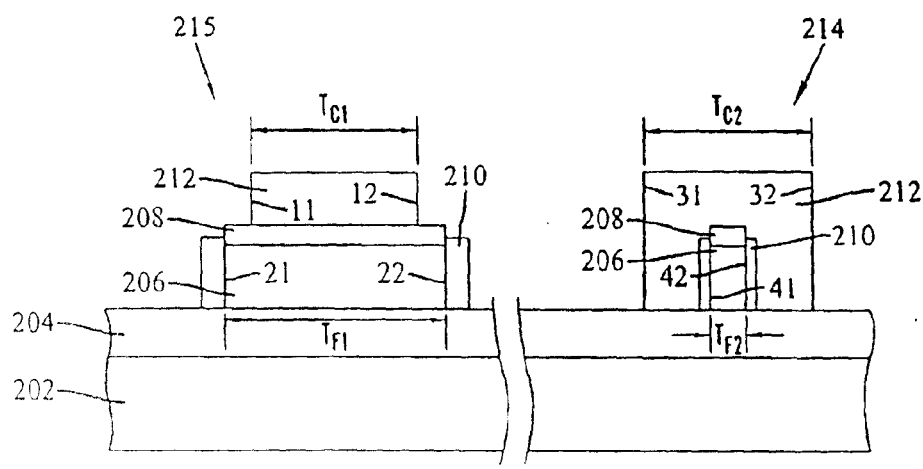

FIG. 8 depicts a cross-sectional side view of a FinFET 250 comprising a gate electrode 255 coupled to the high-voltage decoupling capacitor 215 of FIG. 7b. The gate electrode 255 of the FinFET 250 includes the same conductive material as does the electrode 212 of the capacitor 215, since both the gate electrode 255 of the FinFET 250 and the electrode 212 of the capacitor 215 were both formed from the conductor layer 212 of FIGS. 6a–6b as described supra. In FIG. 8, the FinFET 250 is disposed on the buried insulator 204 and is electrically coupled at a surface 251 of the gate electrode 255 by an interconnect 240 to the top surface 233 of the electrode 212 of the capacitor 215. Instead of the interconnect 240 being connected to the top surface 233 of the electrode 212, the interconnect 240 could alternatively have been connected to the side surface 231 of the electrode 212 or to the side surface 232 of the electrode 212. FIG. 8 also depicts interconnects 241 and 242 respectively connected to the side surfaces 231 and 232 of the electrode 212. While FIG. 8 depicts the FinFET 250 coupled to the capacitor 215, the FinFET 250 may be similarly coupled to the capacitor 214 of FIG. 7b.

Thus, simultaneously with one integration method, any number and combination of nominal-voltage decoupling capacitors, high-voltage decoupling capacitors, the implant variations of nominal-voltage and high-voltage decoupling capacitors, FinFETs, and/or other devices may be formed on substrate 200.

Fin-type decoupling capacitors according to the present invention may be used in many different kinds of circuits, such as high performance logic, low power logic or high density memory devices, including high density multi-gigabit DRAMs. Moreover, as previously illustrated and described, the inventive decoupling capacitors (e.g. nominal-voltage and high-voltage), along with the implant variations of each, may readily be combined with each other and other elements, such as for example CMOS FinFETs, resistors, diodes, memory cells, and so forth, in any combination.

Describing uses of the inventive decoupling capacitors further by way of particular examples, when the inventive decoupling capacitors are ion implanted to be more ideal in their electrical behaviors, they may be used in phase-lock loops where very ideal behavior is important, or other analog components. The high-voltage decoupling capacitor (whether ion implanted or not) may be used in a place where power supply voltage is considerably in excess of the on-chip core voltage. This often occurs in off-chip drivers or analog circuitry that may be on the same chip. The power supply for analog may be 2.5 V while the core logic may be at 1 V. The nominal-voltage decoupling capacitor (whether ion implanted or not) may be used as a decoupling capacitor for the main power supply for all the logic and to keep noise values low.

In summary, the present invention may provide device designs and methods for incorporating capacitors commonly used in planar CMOS technology into a FinFET based technology. The decoupling capacitors of the invention and other circuit devices may be formed at the device level using simple design changes within the same integration method, but without multiple different oxidations and depositions. Thus, simultaneously in one integration method, different designs will yield any number, combination, and/or type of decoupling capacitors of the invention (e.g. nominal-voltage, high-voltage, implant variations of the foregoing, etc.), CMOS FinFETs, and/or other devices on the same substrate in order to provide effective decoupling capacitance in an area-efficient manner with superior high-frequency response.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. For example, the description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

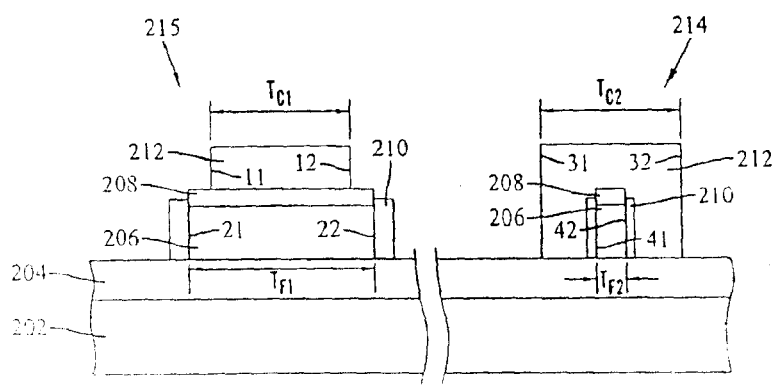

What is claimed is:

1. An integrated circuit chip, comprising a first nominal-voltage decoupling capacitor and a second high-voltage decoupling capacitor, respectively comprising:

a first Fin structure having a first thickness and a second Fin structure having a second thickness greeter than said first thickness, said first Fin structure and said second Fin structure each having a top surface and a first side surface opposite a second side surface, said first thickness being a distance between the first and second side surfaces of the first Fin structure, said second thickness being a distance between the first and second side surfaces of the second Fin structure, said first Fin structure including a single-crystal semiconductor material, said second Fin structure including the single-crystal semiconductor material;

a first insulator structure adjacent the top surface, the first side surface, and the second side surface of the first Fin structure, thereby encapsulating the first Fin structure, and a second insulator structure adjacent the top surface of the second Fin structure; and a first conductor structure adjacent the first insulator structure, and a second conductor structure adjacent the second insulator structure, wherein the second conductor structure partially but not totally overlays the second Fin structure and a thickness of the second conductor structure is within a thickness of the second Fin structure, and wherein the first conductor structure totally overlays the first Fin structure and a thickness of the first Fin structure is within a thickness of the first conductor structure, said thickness of the first conductor structure being oriented in a sonic direction as said thickness of the first Fin structure, said thickness of the second conductor structure being oriented in a same direction as said thickness of the second Fin structure, said first insulator structure comprising a single insulative material distributed from the top surface of the first Fin structure to a bottom surface of the first conductor structure, said second insulator structure comprising a single insulative material distributed from the top surface of the second Fin structure to a bottom surface of the second conductor structure.

2. The integrated circuit chip of claim 1, wherein said second Fin structure has conductivity-enhancing dopant ions therein.

3. A capacitor formed on a substrate, comprising:
a Fin structure having a top surface and a first side surface opposite a second side surface, said Fin structure including a single-crystal semiconductor material;
an insulator structure adjacent the top surface of the Fin structure;
a conductor structure adjacent the insulator structure, wherein the conductor structure totally overlays the Fin structure, wherein a thickness of the Fin structure is within a thickness of the conductor structure, said thickness of the Fin structure being a distance between the first and second side surfaces of the Fin structure, said thickness of the conductor structure being oriented in a same direction as said thickness of the Fin structure, said insulator structure comprising a single insulative material distributed from the top surface of the Fin structure to a bottom surface of the conductor structure; and
an insulator layer such that an entire bottom surface of the Fin structure is in direct mechanical contact with a top surface of the insulator layer.

4. The capacitor of claim 3, wherein the thickness of the Fin structure is in a range of 0.3 nm to 40 nm.

5. The capacitor of claim 3, wherein the Fin structure has a height between 10 nm and 160 nm.

6. The capacitor of claim 3, wherein the conductor structure includes a conductive material selected from the group consisting of a metal, a metal suicide, and doped polysilicon.

7. The capacitor of claim 3, wherein a FinFET is disposed on the substrate, the FinFET having a gate electrode coupled to said conductor structure.

8. The capacitor of claim 3, further comprising:
an insulation film on the first side surface of the Fin structure and in direct mechanical contact with the first side surface of the Fin structure, wherein the insulator structure has a lower surface and an upper surface such that a height of the lower surface of the insulator structure above the top surface of the insulator layer is less than a height of the upper surface of the insulator structure above the top surface of the insulator layer, and wherein a height of a top surface of the insulation film above the top surface of the insulator layer is greater than the height of the lower surface of insulator structure and less the height of the upper surface of the insulator structure.

9. The capacitor of claim 3, wherein the thickness of the Fin structure is greater than 40 nm.

10. A capacitor formed on a substrate, comprising:
a Fin structure having a top surface and a first side surface opposite a second side surface, said Fin structure including a single-crystal semiconductor material;
an insulator structure adjacent the top surface of the Fin structure; a conductor structure adjacent the insulator structure, wherein the conductor structure totally overlays the Fin structure, wherein a thickness of the Fin structure is within a thickness of the conductor structure, said thickness of the Fin structure being a distance between the first and second side surfaces of the Fin structure, said thickness of the conductor structure being oriented in a same direction as said thickness of the Fin structure, said insulator structure comprising a single insulative material distributed from the top surface of the Fin structure to a bottom surface of the conductor structure; and
an insulator layer such that an entire bottom surface of the Fin structure is in direct mechanical contact with a top surface of the insulator layer, wherein a thickness of the insulator structure is about equal to the thickness of the Fin structure, said thickness of the insulator structure being oriented in a same direction as said thickness of the Fin structure.

11. A capacitor formed on a substrate, comprising:
a Fin structure having a top surface and a first side surface opposite a second side surface, said Fin structure including a single-crystal semiconductor material;
an insulator structure adjacent the top surface of the Fin structure; a conductor structure adjacent the insulator structure, wherein the conductor structure totally overlays the Fin structure, wherein a thickness of the Fin structure is within a thickness of the conductor structure, said thickness of the Fin structure being a distance between the first and second side surfaces of the Fin structure, said thickness of the conductor structure being oriented in a same direction as said thickness of the Fin structure, said insulator structure comprising a single insulative material distributed from the top surface of the Fin structure to a bottom surface of the conductor structure;
an insulator layer such that an entire bottom surface of the Fin structure is in direct mechanical contact with a top surface of the insulator layer; and
an insulation film on the first side surface of the Fin structure and in direct mechanical contact with the first side surface of the Fin structure, wherein the insulator structure has a lower surface and an upper surface such that a height of the lower surface of the insulator structure above the top surface of the insulator layer is less than a height of the upper surface of the insulator structure above the top surface of the insulator layer, and wherein a height of a top surface of the insulation film above the top surface of the insulator layer is greater than the height of the lower surface of insulator structure and less the height of the upper surface of the insulator structure.

12. The capacitor of claim 11, wherein the insulation film includes an insulator material that differs from the single insulative material.

13. A capacitor formed on a substrate, comprising:
a Fin structure having a top surface and a first side surface opposite a second side surface, said Fin structure including a single-crystal semiconductor material;
an insulator structure adjacent the top surface of the Fin structure;
a conductor structure adjacent the insulator structure, wherein all conducting material on a top surface or the insulator structure is continuously distributed on the top surface of the insulator structure and is comprised by the conductor structure, wherein the conductor structure partially but not totally overlays the Fin structure, and wherein a thickness of the conductor structure is within a thickness of the Fin structure, said thickness of the Fin structure being a distance between the first and second side surfaces of the Fin structure, said thickness of the conductor structure being oriented in a same direction as said thickness of the Fin structure, said insulator structure comprising a single insulative material distributed from the top surface of the Fin structure to a bottom surface of the conductor structure;

an insulator layer such that an entire bottom surface of the Fin structure is in direct mechanical contact with a top surface of the insulator layer; and an insulation film on the first side surface of the Fin structure and in direct mechanical contact with the first side surface or the Fin structure, wherein the insulator structure has a lower surface and an upper surface such that a height of the lower surface of the insulator structure above the top surface of the insulator layer is less than a height of the upper surface of the insulator structure above the top surface of the insulator layer, wherein a height of a top surface of the insulation film above the top surface of the insulator layer is greater than the height of the lower surface of insulator structure and less the height of the upper surface of the insulator structure, and wherein the insulation film includes an insulator material that differs from the single insulative material.

* * * * *

UNITED STATES PATENT AND TRADEMARK OFFICE
CERTIFICATE OF CORRECTION

| | | |
|---|---|---|
| PATENT NO. | : 6,995,412 B2 | |
| APPLICATION NO. | : 10/063331 | |
| DATED | : February 7, 2006 | |
| INVENTOR(S) | : Fried et al. | |

It is certified that error appears in the above-identified patent and that said Letters Patent is hereby corrected as shown below:

The title page, showing an illustrative figure, should be deleted and substitute therefor the attached title page.

In Drawings

Delete drawing sheet 7 of 8 and substitute therefor the attached sheet 7 of 8 containing figures 7A and 7B.

Column 2
Line 10, delete "length also" and insert -- length (also --

Column 10
Line 7, insert -- . -- after $T_{cl}$
Lines 9 and Line 20, delete "7a - 7h" and insert -- 7a - 7b --
Line 12, delete "in die claims" and insert -- in the claims --
Line 13, delete "arc" and insert -- are --

Column 12
Line 34, delete "greeter" and insert -- greater --
Line 60, delete "sonic" and insert -- same --

Column 13
Line 34, delete "suicide" and insert -- silicide --

Column 14
Line 56, delete "or" and insert -- of --

Signed and Sealed this

Twenty-fourth Day of October, 2006

JON W. DUDAS
*Director of the United States Patent and Trademark Office*

United States Patent
Fried et al.

(10) Patent No.: US 6,995,412 B2
(45) Date of Patent: Feb. 7, 2006

(54) INTEGRATED CIRCUIT WITH CAPACITORS HAVING A FIN STRUCTURE

(75) Inventors: David M. Fried, Ithaca, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 10/063,331

(22) Filed: Apr. 12, 2002

(65) Prior Publication Data
US 2003/0193058 A1 Oct. 16, 2003

(51) Int. Cl.
  H01L 27/108 (2006.01)
  H01L 29/76 (2006.01)
  H01L 29/94 (2006.01)
  H01L 31/119 (2006.01)

(52) U.S. Cl. .................. 257/296; 257/303; 257/306

(58) Field of Classification Search .......... 257/296, 257/300, 301, 303, 306, 68, 71, 313, 516, 257/532, 528, 535
See application file for complete search history.

(56) References Cited

U.S. PATENT DOCUMENTS

| | | | |
|---|---|---|---|
| RE32,090 E | 3/1986 | Jaccodine et al. | |
| 4,704,368 A | 11/1987 | Goth et al. | |
| 5,013,680 A | 5/1991 | Lowrey et al. | |
| 5,105,245 A | 4/1992 | Riemenschneider et al. | |
| 5,225,363 A | 7/1993 | Riemenschneider et al. | |
| 5,356,826 A * | 10/1994 | Natsume | 438/238 |
| 5,566,051 A | 10/1996 | Burns | |
| 5,573,967 A | 11/1996 | Tseng | |
| 5,619,067 A | 4/1997 | Sua et al. | |
| 5,786,985 A | 7/1998 | Taniguchi et al. | |
| 5,838,032 A * | 11/1998 | Ting | 257/211 |
| 5,869,859 A * | 2/1999 | Hanagasaki | 257/296 |
| 5,898,982 A | 5/1999 | Metzler et al. | |
| 5,902,126 A | 5/1999 | Hong et al. | |
| 5,956,236 A | 9/1999 | Corisis et al. | |
| 5,976,960 A | 11/1999 | Cheffings | |
| 5,995,378 A | 11/1999 | Farnsworth et al. | |
| 6,037,620 A | 3/2000 | Hoeningschmid et al. | |

(Continued)

FOREIGN PATENT DOCUMENTS

JP 183254 A 7/1995

OTHER PUBLICATIONS

"FinFet Process Demonstration, Deliverable Report: Test Chip and Process Design", King, et al., Task ID. 850.002.

*Primary Examiner*—Hoa Pham
(74) *Attorney, Agent, or Firm*—Schmeiser, Olsen & Watts; William Sabo

(57) ABSTRACT

Device designs and methods are described for incorporating capacitors commonly used in planar CMOS technology into a FinFET based technology. A capacitor includes at least one single-crystal Fin structure having a top surface and a first side surface opposite a second side surface. Adjacent the top surface of the at least one Fin structure is at least one insulator structure. Adjacent the at least one insulator structure and over a portion of the at least one Fin structure is at least one conductor structure. Decoupling capacitors may be formed at the circuit device level using simple design changes within the same integration method, thereby allowing any number, combination, and/or type of decoupling capacitors to be fabricated easily along with other devices on the same substrate to provide effective decoupling capacitance in an area-efficient manner with superior high-frequency response.

13 Claims, 8 Drawing Sheets